United States Patent [19]

Liu

[11] Patent Number: 5,963,040
[45] Date of Patent: Oct. 5, 1999

[54] METHOD AND APPARATUS FOR DETECTING PIN-HOLES IN A PASSIVATION LAYER

[75] Inventor: Chin-Kai Liu, Tai-chung, Taiwan

[73] Assignee: Taiwan Semiconductor Manufacturing Co. Ltd., Hsin-Chu, Taiwan

[21] Appl. No.: 08/936,251

[22] Filed: Sep. 24, 1997

[51] Int. Cl.[6] .......................... G01N 27/20; G01N 27/28; G01R 31/12

[52] U.S. Cl. .......................... 324/551; 324/450; 324/765; 324/71.1

[58] Field of Search .................................. 324/450, 551, 324/557, 765, 766

[56] References Cited

U.S. PATENT DOCUMENTS 4,103,228  7/1978  Ham ........................................ 324/537
5,059,913  10/1991  Nigro et al. .............................. 324/557
5,504,017  4/1996  Yue et al. .............................. 324/766 X Primary Examiner—Glenn W. Brown
Attorney, Agent, or Firm—Tung & Associates

[57] ABSTRACT

The present invention discloses a novel method and apparatus for de-etching pin-holes in a passivation layer that is deposited over a metal conductor layer on the surface of a semiconductor wafer by utilizing a substantially clear, electrically conductive film as a top electrode immersed in an electrolyte for observing under an optical microscope bubbles generated from a pin-hole on the wafer surface which functions as a bottom electrode when a DC current is flowing through the top electrode, the electrolyte and the bottom electrode such that gases in the form of bubbles are generated at the pin-hole site where metal is exposed to the electrolyte.

25 Claims, 1 Drawing Sheet

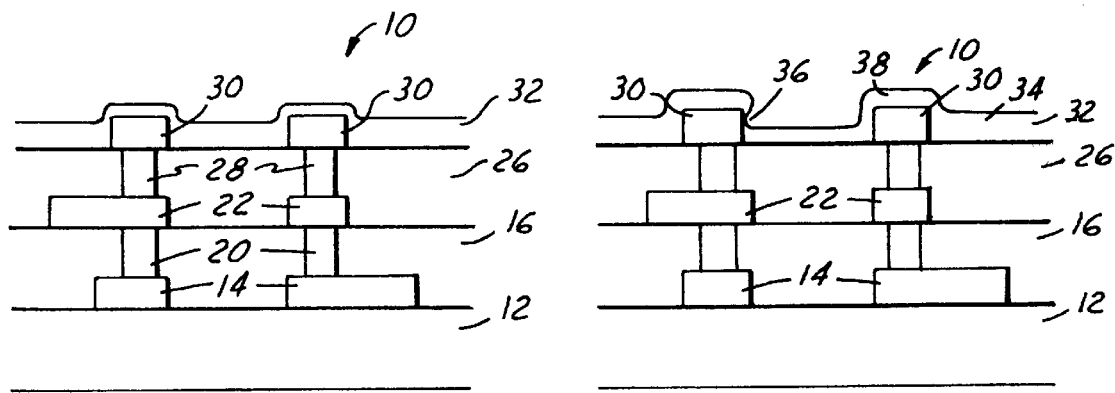
(PRIOR ART)
FIG.1
(PRIOR ART)
FIG.2
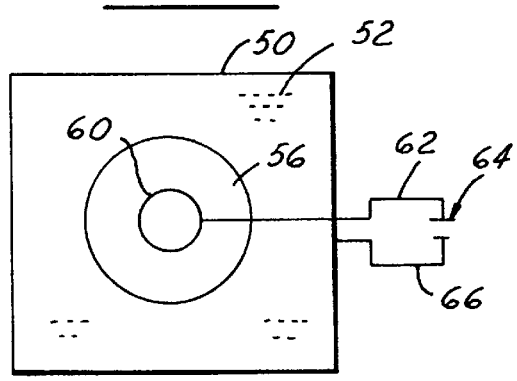
(PRIOR ART)
FIG.3
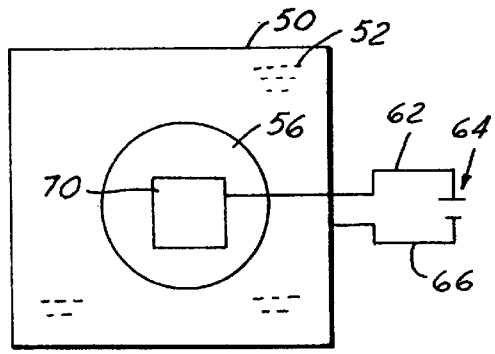
FIG.4
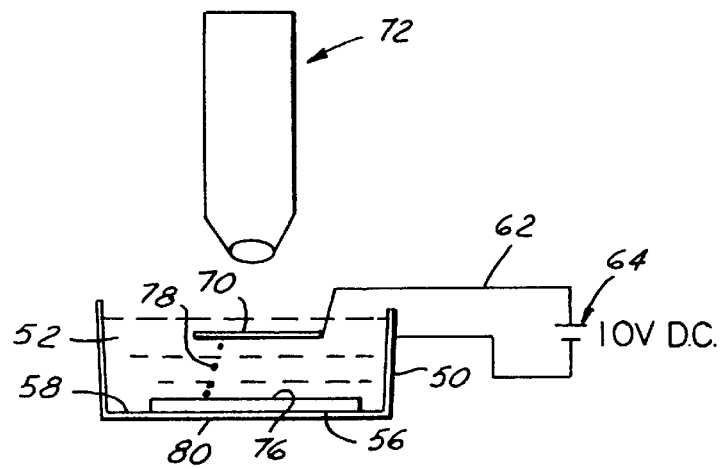
FIG.5

METHOD AND APPARATUS FOR DETECTING PIN-HOLES IN A PASSIVATION LAYER

FIELD OF THE INVENTION

The present invention generally relates to a method for detecting cavities in an insulating layer that is deposited over a conductive layer on an electronic substrate and more particularly, relates to a method for detecting pin-holes in a passivation layer deposited over a metal conductor layer on a wafer surface by immersing the wafer in an electrolyte and using the wafer as a bottom electrode, then using a substantially transparent and electrically conductive film as an upper electrode such that electrolysis reaction occurs at pin-hole locations resulting in the generation of gas bubbles.

BACKGROUND OF THE INVENTION

In a semiconductor fabrication process, i.e., for memory devices, numerous metal interconnects and vias are used to provide electrical communication between various devices constructed on a semiconductor wafer which are insulated by inter-metal dielectric layers. In conventional devices, only one or two levels of such metal conducting layers are necessary for connecting the devices on various layers. However, modern high-capacity memory devices demand as many as five or six metal interconnect layers for completing the circuits of the memory device. The inter-metal dielectric (IMD) layers are normally formed of an insulating material such as silicon oxide. Each layer of the insulating material is planarized before the formation of the next layer device and the deposition of the inter-metal dielectric layer. This is shown in FIG. 1 for a conventional memory device that has two layers of metal interconnects.

Referring initially to FIG. 1, wherein a memory device 10 that is built on a silicon substrate 12 is shown. On top of the silicon substrate 12, a first level metal 14 is deposited for establishing electrical communication with devices built in the silicon substrate 12. A first inter-metal dielectric layer 16 is then used to insulate the first level metal 14. Metal studs 20 are then provided for establishing electrical communication with the next level devices. After the first level IMD 16 is planarized, a second level metal 22 is deposited and patterned for connection to the metal studs 20. A second level IMD 26 is then formed of an oxide material to further insulate the second level metal 22. After the formation of the metal studs 28 and the planarization of the second IMD layer 26, a third and final metal layer is deposited and formed into metal lines 30. On top of the metal lines 30, a final passivation layer 32 is deposited to insulate the metal lines 30.

The final insulating layer 32 is frequently formed of two insulating materials, i.e., first a silicon oxide layer (not shown) for insulating purpose, and then a silicon nitride layer (not shown) for use as a moisture barrier. The silicon oxide layer is frequently deposited to a thickness of about 2,000 Å, while the silicon nitride layer is frequently deposited to a thickness of about 7,000 Å. This is shown at locations 34 and 38 in FIG. 2.

In a chemical vapor deposition process for depositing silicon oxide and silicon nitride, the thicknesses of the insulating layers deposited on the sidewall portions of the metal lines 30 are frequently inadequate. This is especially true when the metal lines are closely positioned together. When an inadequate thickness of the insulating layers is deposited on the sidewalls of the metal lines, a cavity or a pin-hole 36 can be formed. The pin-hole 36 is normally of a very small size and cannot be observed by visual examination.

A conventional method that has been used for detecting cavities or pin-holes in an insulating layer deposited on top of a semiconductor substrate is shown in FIG. 3. A fluid reservoir 50 that is frequently constructed of an electrically conductive material such as metal is first provided. Into the fluid reservoir 50, an electrolyte 52 is filled to near the top of the reservoir. A pre-processed semiconductor wafer 56 which has a passivation layer deposited on top is then placed on the bottom of the reservoir 50 in contact with the electrically conductive material of the reservoir. The wafer 56 is therefore electrically connected to the fluid reservoir and functions as a bottom electrode in an electrolysis reaction later performed.

Into the electrolyte solution 52, and above the immersed semiconductor wafer 56, is placed a metal wire 60 which functions as a top electrode. The dimension of the circular-shaped wire is approximately 1 cm in diameter. The metal wire 60, which is electrically conductive, is then connected to one end 62 of a DC power supply 64. The other end 66 of the DC power supply 64 is then connected to the fluid reservoir 50 such that electrical current flows through the wafer 56 and the electrolyte 52 to the top electrode 60. A suitable DC voltage used can be 10 volts, even though other suitable voltages may also be used.

The principle of operation for the apparatus shown in FIG. 3 can be explained as follows. When a cavity or a pin-hole (3 6 as shown in FIG. 2) exists in the passivation layer on the wafer 56, the metal line 30, which is frequently formed of an aluminum material under the passivation layer 32 is exposed to the outside environment through pin-hole 36. The aluminum surface exposed at pin-hole 36 therefore acts as a bottom electrode to establish a current flow between pin-hole 36 and the top electrode 60. The electrolyte solution, which is frequently a mixture of isopropyl alcohol and deionized water, at the site of the pin-hole 36 undergoes an electrolysis reaction by producing hydrogen and oxygen gases in bubble form. An optical microscope is then used to observe a string of bubbles produced at the pin-hole to surface in the electrolyte solution. The locations of the pin-holes can thus be identified.

The conventional apparatus illustrated in FIG. 3 is crude and does not function properly for several reasons. First, the electric field generated by the metal wire 60 used as a top electrode is not uniform. The field is stronger at locations closer to the wire and weak at the center of the circle. This leads to a problem that electrolysis reaction may not occur where the electric field is weak. Secondly, the metal wire 60 used is not transparent, and as such, the portion of the wafer that is directly under the wire can not be observed. Some of the bubble formation may not be apparent when it occurs directly under or near a metal wire to an observer. Thirdly, on the surface of the semiconductor wafer 56, there also exists numerous bonding pads which are exposed metal that generates bubbles during the examination for pin-holes. When a pin-hole exists at or near a bonding pad location, the metal wire frequently blocks the view and makes it more difficult to observe any pin-holes since bubbles from a bonding pad and bubbles from a pin-hole can not be distinguished. The conventional apparatus and method for detecting pin-holes in a passivation layer therefore needs much improvement for it to be used as a reliable quality control method.

It is therefore an object of the present invention to provide a method for detecting cavities in an insulating layer deposited over a conductive layer does not have the drawbacks or shortcomings of the conventional methods.

It is another object of the present invention to provide a method for detecting pin-holes in a passivation layer deposited over a metal line on a semiconductor wafer that is reliable, and accurate.

It is a further object of the present invention to provide a method for detecting pin-holes in a passivation layer deposited over a metal line on a semiconductor wafer that is based on an electrolysis reaction during which bubbles are produced at pin-hole locations.

It is still another object of the present invention to provide a method for detecting pin-holes in a passivation layer deposited over a metal line on a semiconductor wafer that utilizes a substantially transparent, conductive film as an upper electrode for the easy observation of bubble formation during an electrolysis reaction occurring at the pin-hole site.

It is yet another object of the present invention to provide a method for detecting pin-holes in a passivation layer deposited over a metal line on a semiconductor wafer by utilizing a clear, conductive film as an upper electrode and a mixture of isopropyl alcohol and deionized water as an electrolyte.

It is another further object of the present invention to provide a method for detecting pin-holes in a passivation layer deposited over a metal conductor layer on a semiconductor wafer by utilizing an upper electrode formed by depositing metal particles on a clear glass plate.

It is still another further object of the present invention to provide an apparatus for detecting pin-holes in a passivation layer deposited over a metal conductor layer on a semiconductor wafer incorporating an improved upper electrode that is a substantially transparent and conductive film.

SUMMARY OF THE INVENTION

In accordance with the present invention, a method and apparatus for detecting pin-holes in a passivation layer deposited over a metal conductor layer on a semiconductor wafer are provided in which an improved upper electrode is formed by depositing metal particles on a clear film such that bubble formation from a pin-hole site can be readily observed through the film in an electrolysis reaction.

In a preferred embodiment, a method for detecting cavities in an insulating layer that is deposited over a conductive metal layer on a semiconducting substrate can be carried out by the operating steps of first providing a fluid reservoir that is constructed of an electrically conductive material, then filling the fluid reservoir with an electrolyte, then positioning a semiconducting substrate in intimate contact with the bottom surface of the reservoir such that the substrate functions as a bottom electrode, then positioning a substantially transparent and electrically conductive film over the substrate and in an electrolyte for use as a top electrode, then flowing a current through the top electrode, the electrolyte and the bottom electrode such that an electrolysis reaction occurs at cavities where the conductive metal layer is exposed and gaseous components of the electrolyte in the form of bubbles are generated for indicating locations of the cavities when observed under an optical microscope.

In another preferred embodiment, an optical microscopy method for detecting pin-holes in a passivation layer deposited over a metal conductor layer on a pre-processed semiconductor wafer can be carried out by the operating steps of first providing an electrolyte tank filled with an electrolyte wherein the tank is constructed of an electrically conductive material, then positioning a pre-processed semiconductor wafer on the bottom surface of the electrolyte tank such that the wafer is used as a bottom electrode, then positioning a substantially transparent and conductive plate in the electrolyte and over the wafer for use as a top electrode, then flowing a DC current through the bottom electrode, the electrolyte and the top electrode such that an electrolysis reaction occurs at the bottom of the pin-holes where a metal layer is exposed producing bubbles of the gas components of the electrolyte to indicate the locations of the pin-holes when observed under an optical microscope.

BRIEF DESCRIPTION OF THE DRAWINGS

These and other objects, features and advantages of the present invention will become apparent from the following detailed description and the appended drawings in which:

FIG. 1 is an enlarged, cross-sectional view of a conventional memory device having two layers of metal interconnect structures.

FIG. 2 is an enlarged, cross-sectional view of the memory device shown in FIG. 1 having a pin-hole in the passivation layer.

FIG. 3 is a plane view of a conventional apparatus for detecting pin-holes in a passivation layer deposited on a semiconductor wafer immersed in an electrolyte tank.

FIG. 4 is a plane view of a present invention apparatus for detecting pin-holes in a passivation layer deposited on top of a semiconductor wafer immersed in an electrolyte tank.

FIG. 5 is a side view of the present invention apparatus shown in FIG. 4 for the observation of pin-holes in a passivation layer deposited on top of a semiconductor wafer illustrating the use of a transparent, conductive film as an upper electrode.

DETAILED DESCRIPTION OF THE PREFERRED EMBODIMENT

The present invention discloses a method for detecting cavities in an insulating layer that is deposited over a conductive metal layer on a semiconducting substrate by using a substantially clear, electrically conductive film as an upper electrode and by immersing the substrate in an electrolyte for use as a lower electrode so that bubbles evolved during an electrolysis reaction at a pin-hole site where metal is exposed can be observed.

Referring now to FIG. 4 wherein a plane view of the present invention apparatus for detecting pin-holes in a passivation layer deposited on top of a metal conductor layer is illustrated. The apparatus consists of a fluid reservoir 50 (also shown in FIG. 5) that is constructed of an electrically conductive material such as metal. It should be noted that a fluid reservoir that is not constructed of an electrically conductive material may also be used. In such instances, the end 62 of the power source 64, is connected to the clear, conductive film 70. The other end 66 is connected to the reservoir 50. It should be noted that, for illustration purpose, the components shown in FIGS. 3, 4, and 5 are not drawn to scale.

As shown in FIGS. 4 and 5, the semiconductor wafer 56 is positioned on the bottom surface 58 of the reservoir 50 such that the wafer 56 is directly connected to the end 66 of the power source 64. The fluid tank 50 is then filled with a suitable electrolyte 52 to enable an electrolysis reaction to occur at a pin-hole site. A suitable electrolyte can be any frequently used electrolyte. A mixture of isopropyl alcohol and deionized water (DI water) at a mix ratio of 1:1 has been used successfully in the present invention preferred embodiment method. However, any other suitable mix ratio such as one that is between 5:1 and 1:5 of isopropyl alcohol:DI water can also be used.

Into the electrolyte solution 52, a substantially clear and electrically conductive film 70 is then placed and supported by suitable means (not shown). The support means for the film 70 should be adequate for moving the film around in tank 50 without problem to cover substantially the entire area of the wafer 56.

A suitable clear, conductive film to be used in the present invention can be made by sputter depositing metal particles on a clear glass slide or plate. The sputtering method enables a uniform distribution of fine particles of a metal such as platinum, gold, chromium, titanium or any other suitable metal to be deposited on the clear glass slide. A thickness of between about 100 Å and about 1,000 Å of the metal layer is desirable. It is desirable to obtain a uniform distribution of metal particles on the slide so that a uniform electric field can be formed in the electrolyte near the slide surface. Other substantially clear, electrically conductive film or sheet can also be used. A possible candidate is an electrically conductive polymer or a polymer that is made conductive by doping with chlorine. One requirement is that the film or sheet should be substantially transparent so that bubbles formed on the surface of the wafer can be readily observed. This is important since the bubbles generated are frequently of very small size which cannot be seen by the naked eye. An optical microscope at a magnification ratio of approximately 200 times can be employed for such observation. The optical microscope 72, as shown in FIG. 5, should be directed toward the wafer 56 through the clear film 70. The fluid reservoir 50 is frequently positioned on a stage that can be moved in both X and Y directions for repositioning the observation point on the wafer surface 76.

A direct current power source of 10 volts is utilized in the present invention preferred embodiment method. However, any other suitable DC voltage may be utilized as long as an electrolysis reaction can be triggered when a pin-hole or cavity in the passivation layer is present. When a pin-hole is present, the exposed metal layer, i.e., of aluminum, functions as a bottom electrode and triggers an electrolysis reaction between the pin-hole and the upper electrode of the clear film 70. The electrolyte of isopropyl alcohol/DI water mixture undergoes a dissociation reaction at the metal surface such that hydrogen and oxygen components of the electrolyte are produced in the form of minute bubbles. The minute bubbles 78 can then be observed by the optical microscope 72 and that the pin-hole location 80 can be accurately determined. The final passivation layer is normally formed of silicon oxide and silicon nitride layers having a total thickness between about 3,000 Å and about 10,000 Å, and preferably between about 5,000 Å and 9,000 Å.

The present invention method and apparatus are more superior than the conventional method and apparatus where a metal wire is used as the top electrode. The clear conductive film used in the present invention apparatus enables a uniform electric field to be generated such that an electrolysis reaction can be easily triggered when a pin-hole is present. Moreover, since the film is substantially clear, there is no wire to block the view of the observer during the observation of minute bubbles under the microscope. The present invention novel method further enables pin-holes that are normally difficult to detect, i.e., those occurring at or near a bond pad, to be detected since an improved view is possible with the present invention method.

The present invention novel method and apparatus are amply demonstrated and described in the above descriptions and in FIGS. 4 and 5. By practicing the present invention novel method and utilizing the present invention novel apparatus, minute pin-holes or cavities in the passivation layer deposited on a metal conductor layer on the surface of a semiconductor wafer can be easily detected by the minute bubbles generated from the pin-hole site and observed through a clear conductive film.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for detecting cavities in an insulating layer deposited over a conductive layer on a semiconducting substrate comprising the steps of:
   providing a fluid reservoir constructed of an electrically conductive material,
   filling the fluid reservoir with an electrolyte,
   positioning said semiconducting substrate on a bottom surface of and in intimate contact with the reservoir such that the substrate functions as a bottom electrode,
   positioning a substantially transparent and electrically conductive film over said substrate and in said electrolyte for use as a top electrode,
   flowing a current through said top electrode, said bottom electrode and said electrolyte such that an electrolysis reaction occurs at cavities where said conductive layer is exposed and gaseous components of said electrolyte in the form of bubbles are generated for indicating locations of said cavities.

2. A method according to claim 1, wherein said electrolyte is at least one component selected from the group consisting of isopropyl alcohol and deionized water.

3. A method according to claim 1, wherein said electrolyte is a mixture of isopropyl alcohol and deionized water.

4. A method according to claim 1, wherein said electrolyte is a mixture of isopropyl alcohol and deionized water in a mix ratio between about 1:5 and about 5:1.

5. A method according to claim 1, wherein said electrolyte is a mixture of isopropyl alcohol and deionized water in a mixing ratio of 1:1.

6. A method according to claim 1, wherein said gaseous components of the electrolyte produced in the form of bubbles are hydrogen and oxygen gas.

7. A method according to claim 1, wherein said substantially transparent and conductive film is formed by coating conductive particles onto a substantially transparent substrate.

8. A method according to claim 1, wherein said substantially transparent and conductive film is formed on a glass plate.

9. A method according to claim 1, wherein said substantially transparent and conductive film is formed by coating metal particles onto a glass plate.

10. A method according to claim 9, wherein said metal particles are selected from the group consisting of platinum, gold, chromium and titanium.

11. A method according to claim 9, wherein said metal particles are coated onto a glass plate to a thickness between about 100 Å and about 1,000 Å.

12. A method according to claim 1, wherein said substantially transparent and conductive film is formed by sputter coating metal particles onto a glass plate.

13. A method according to claim 1, wherein said insulating layer comprises silicon oxide and silicon nitride having a total thickness between about 3,000 Å and about 10,000 Å.

14. A method according to claim 1, wherein the conductive layer onto which an insulating layer is deposited on is an aluminum layer.

15. An optical microscopy method for detecting pin-holes in a passivation layer deposited over a metal layer on a pre-processed semiconductor wafer comprising the steps of:

providing an electrolyte tank filled with an electrolyte, said tank is constructed of an electrically conductive material, positioning said pre-processed semiconductor wafer on the bottom surface of the electrolyte tank such that the wafer is used as a bottom electrode, positioning a substantially transparent and conductive film in the electrolyte and over the wafer for use as a top electrode, flowing a DC current through said bottom electrode, said electrolyte and said top electrode such that an electrolysis reaction occurs at the bottom of the pin-holes where the metal layer is exposed to produce bubbles of the gas components of the electrolyte to indicate the locations of the pin-holes when observed under an optical microscope.

16. An optical microscopy method according to claim 15, wherein said passivation layer is at least one material selected from the group consisting of silicon oxide and silicon nitride.

17. An optical microscopy method according to claim 15, wherein said metal layer is an aluminum layer.

18. An optical microscopy method according to claim 15, wherein said substantially transparent and conductive film is formed by coating conductive particles onto a substantially transparent substrate.

19. An optical microscopy method according to claim 15, wherein said substantially transparent and conductive film is formed by coating, metal particles onto a glass plate.

20. An optical microscopy method according to claim 15, wherein said passivation layer comprises plasma enhanced oxide and plasma enhanced nitride having a total thickness between about 3,000 Å and about 10,000 Å.

21. An optical microscopy method according to claim 15, wherein said electrolyte is at least one component selected from the group consisting of isopropyl alcohol and deionized water.

22. An optical microscopy method according to claim 15, wherein said electrolyte is a mixture of isopropyl alcohol and deionized water in a mix ratio between about 1:5 and about 5:1.

23. An optical microscopy method according to claim 15, wherein said gaseous components of the electrolyte produced in the form of bubbles are hydrogen and oxygen gas.

24. An apparatus for detecting pin-holes in a passivation layer deposited over a metal layer on a pre-processed semiconducting wafer comprising:

a fluid reservoir tank of an electrically conductive material for holding said wafer and an electrolyte filling said fluid reservoir tank, a substantially transparent and electrically conductive film for functioning as a top electrode, and a power source for supplying a current flowing through a bottom electrode, said electrolyte and said top electrode such that an electrolysis reaction occurs at bottoms of said pin-holes where said metal layer is exposed to produce bubbles of gas components of said electrolyte to indicate locations of said pin-holes when observed under an optical microscope.

25. An apparatus according to claim 24 further comprising an optical microscope for observing minute bubbles generated at pin-holes under said substantially transparent and electrically conductive film.

* * * * *